United States Patent [19]

Farrar et al.

[11] 4,423,547

[45] Jan. 3, 1984

[54] METHOD FOR FORMING DENSE MULTILEVEL INTERCONNECTION METALLURGY FOR SEMICONDUCTOR DEVICES

[75] Inventors: Paul A. Farrar, South Burlington; Robert M. Geffken, Burlington, both of Vt.; Charles T. Kroll, Raleigh, N.C.

[73] Assignee: International Business Machines Corporation, Armonk, N.Y.

[21] Appl. No.: 269,230

[22] Filed: Jun. 1, 1981

[51] Int. Cl.³ .............................................. H01L 21/04
[52] U.S. Cl. ........................................ 29/571; 29/578; 148/1.5; 156/653; 357/71
[58] Field of Search .......................... 29/571, 578, 579; 148/1.5; 156/643, 653, 659.1; 430/314, 316, 317; 357/59, 71

[56] References Cited

U.S. PATENT DOCUMENTS

| 3,700,497 | 10/1972 | Epifano et al. | 29/578 X |
| 3,844,831 | 10/1974 | Cass et al. | 156/633 X |
| 3,846,166 | 11/1974 | Saiki et al. | 357/71 X |
| 3,936,865 | 2/1976 | Robinson | 357/68 |
| 4,001,870 | 1/1977 | Saiki et al. | 357/71 X |

OTHER PUBLICATIONS

Ryden et al., "A Metallization Providing Two Levels ... Integrated Circuits," Tech. Dig. IEDM 1976, pp. 597–600 (12-6-76).
Aimi et al., "Solder Reflow Flip Chip Pad Transfers," IBM Tech. Discl. Bull., vol. 19, No. 3, p. 824 (8-76).
Heuber et al., "Self-Aligned Multiline Via Hole," IBM Tech. Discl. Bull., vol. 20, No. 9, pp. 3526–3527 (2-78).

Primary Examiner—Brian E. Hearn
Assistant Examiner—David A. Hey
Attorney, Agent, or Firm—Howard J. Walter, Jr.

[57] ABSTRACT

A method for providing high density multiple level metallurgy for integrated circuit devices in which a relatively thin layer of plasma produced silicon nitride is deposited over a first level of interconnection metallurgy formed on a layer of silicon oxide. Overlap via holes are etched in the nitride layer followed by deposition of a thicker layer of polyimide forming polymer. A second set of via holes larger than the first are provided in the polymer layer and a second layer of interconnection metallurgy is then deposited by a lift-off deposition technique.

8 Claims, 9 Drawing Figures

METHOD FOR FORMING DENSE MULTILEVEL INTERCONNECTION METALLURGY FOR SEMICONDUCTOR DEVICES

BACKGROUND OF THE INVENTION

1. Field of the Invention

This invention relates to the fabrication of semiconductor devices and more particularly to the formation of high density multilevel metal interconnection systems for integrated circuit devices.

2. Description of the Prior Art

The primary advantage integrated circuit semiconductor devices have other discrete component technologies lies in their ability to provide a large number of circuit functions within single integrated circuit component. The more circuitry which can be provided within a fixed area of semiconductor, the cheaper the cost. In the past, significant advances have been made in reducing the size of integrated circuit elements such that many thousands of devices can be provided on a single chip. The packing density of various semiconductor technological elements is determined by a number of independent parameters, the most important of which is photolithographic pattern size which effectively controls the minimum achievable size of the various elements, particularly that of the interconnection metallurgy.

Early integrated circuit technology was considerably less dense than more recent technologies and utilized only a single layer of aluminum-based metallurgy, in combination with diffused regions in the semiconductor substrate, to provide interconnection between various individual circuit elements. Such single-metal interconnection systems provided only limited wiring capability. With the development of refractory metallurgy and low temperature passivation processes, double-layer metallurgy techniques in which metal-to-metal vertical connections were made through via holes in the dielectric layer separating the metal layers became possible. Since the interlevel dielectric layers were usually formed by a material having similar physical characteristics to the dielectric layer separating the first metal layer from the substrate, it was necessary to provide an expanded pad area in the first level metal in order to insure that the etched metal-to-metal via holes could not penetrate to the substrate, thereby causing both the first and second metal layers to be shorted to the substrate. Because both the metal layers and the via holes were formed at different times, three photomasking steps and their accompanying alignment tolerances were required, thereby severely limiting the maximum achievable circuit density.

U.S. Pat. No. 3,844,831 to Cass et al and U.S. Pat. No. 3,936,865 to Robinson, teach a method of eliminating the expanded first metal via pads through the use of two different materials for the dielectric layers over and under the first metal layer. By relying on the different etching characteristics of the two dielectric layers, the expanded first metal via pad could be eliminated. Since the etching of the via exposing the first layer of metal was self-stopping when it reached the first dielectric layer, oversize vias could be used to ensure that, in the presence of mask alignment tolerances, the first metal line was adequately exposed.

Additional improvements in multilevel metallurgy technology are taught in the following references.

The article, "Self-Aligned Multiline Via Hole," K. Heuber et al, IBM Technical Disclosure Bulletin, Vol. 20, No. 9, February 1978, pp. 3526-7, teaches the use of a single large via hole to expose a plurality of first metal lines which are to be contacted by a plurality of second level metal lines.

U.S. Pat. No. 3,700,497 to Epifano et al and U.S. Pat. No. 4,001,870 to Saiki et al, both teach multilevel metallurgy systems in which an organic polymer, polyimide, is used for the interlevel dielectric.

The paper, "A Metallization Providing Two Levels of Interconnect for Beam Leaded Silicon Integrated Circuits," W. D. Ryden et al, Technical Digest 1976 International Electron Devices Meeting, Dec. 6, 7, and 8, 1976, Washington, D.C., pp. 597-600, teaches a multilevel interconnection system in which a thick layer of silicon nitride is used as the metal interlevel dielectric.

The article, "Solder Reflow Flip Chip Pad Transfers," B. R. Aimi et al, IBM Technical Disclosure Bulletin, Vol. 19, No. 3, August 1976, p. 824, is of interest, as it teaches the use of at least a partial layer of a polymeric material and a layer of inorganic insulator, quartz, to form the interlevel dielectric between two levels of metal in a multilevel interconnection system.

The density of known double-level metallurgy interconnection systems has been limited by the inability to make closely-spaced via holes through the interlevel dielectric between the metal layers, either because of the inability to selectively etch the interlevel dielectric layer or because of excessive etch bias introduced by the required thickness of the interlevel dielectric.

SUMMARY OF THE INVENTION

It is an object of this invention to provide increased circuit density for integrated circuits without increasing the pitch or spacing of first level metal lines and without reducing interconnection reliability.

Another object of the invention is to provide a process for achieving maximum interconnection via hole density for multilevel metallurgy systems.

These and other objects are provided by the process of the invention in which a multicomponent interlevel dielectric is provided in conjunction with a via hole etching technique whereby via holes are initially plasma etched in a relatively thin silicon nitride layer followed by deposition of an organic polymeric dielectric layer in which corresponding oversize via holes are etched. High density selectively deposited metal lines are provided by the use of a lift-off technique.

These and other objects, features and advantages of the invention will be apparent from the following, more particular description of the preferred embodiment of the invention, as illustrated in the accompanying drawings.

DESCRIPTION OF THE PREFERRED EMBODIMENT

Although the preferred embodiment is described in terms of a specific process application, those skilled in the art will recognize that the invention is generally applicable to any integrated circuit manufacturing process in which multilevel metallurgy is desired.

Figure 1:
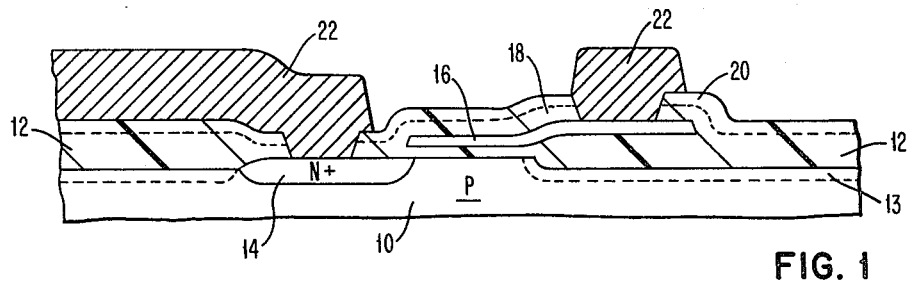
FIG. 1 is a cross-sectional schematic view of a partially fabricated integrated circuit device processed to a point at which a first level layer has been selectively defined to make contact to both the substrate and to a polysilicon electrode.

Referring to FIG. 1, there is shown a cross-sectional view of a partially fabricated polysilicon gate MOSFET integrated circuit device. This device may be provided in accordance with the teaching in co-pending U.S. patent application Ser. No. 214,940, entitled "Method of Making Low Leakage Shallow Junction IGFET Devices", filed Dec. 10, 1980, now U.S. Pat. No. 4,329,773, by Geipel et al and assigned to the instant assignee. This co-pending application is incorporated herein by reference.

Generally, the integrated circuit device of FIG. 1 includes a p-type silicon substrate 10 having active device regions and field regions, defined by recessed field oxide 12 and p+ channel stopper layer 13, formed in a surface thereof. Ion implanted and diffused n+ regions 14 are formed in a self-aligned manner as defined by field oxide regions 12 and polysilicon gate electrode 16. Regions 14 and gate electrodes 16 are initially isolated by the growth of a thermal oxide layer 18 followed by a blanket CVD phosphorus doped oxide layer 20 for passivation purposes. In order to provide contact to upper layers of interconnection metallurgy, contact holes are etched, preferably by a plasma process, to expose areas of region 14, polysilicon gate 16 and, if desired, substrate 11 (not shown). Next, aluminum-copper-silicon first level metallurgy layer 22 is provided by an evaporation process, see for example U.S. Pat. No. 3,474,530 by Ainslie et al and U.S. Pat. No. 3,725,309 by Ames et al for copper doped aluminum and U.S. Pat. No. 3,567,509 by Kuiper for aluminum-copper-silicon deposition techniques. Metal layer 22 is preferably provided by a lift-off deposition technique, such as described in U.S. Pat. No. 4,212,935 by Canavello et al, in order to provide maximum density achievable by the substantially vertical edges produced by lift-off deposition. Ohmic contact between layer 22 and underlying silicon areas is preferably achieved by providing a palladium-silicide layer in the contact holes prior to deposition of layer 22. This can be accomplished by the well-known technique of blanket deposition of palladium, sintering to form the desired silicide and then selectively etching unreacted palladium from the oxide passivated non-contact areas. As indicated above, the process and resulting structure as shown in FIG. 1, represents a typical semiconductor fabrication process through the steps of providing a first level of metallurgy. The polysilicon in this example is not considered as interconnection metallurgy since in most polysilicon processes the polysilicon is not fully exploited as an interconnection layer matrix, although it could be.

For purposes of illustration, the following approximate final dimensions have been found to provide excellent devices.

| Layer | Thickness (A) |
|---|---|
| recessed oxide 12 | 5000 |
| polysilicon 16 | 2500 |
| polysilicon oxide 18 | 2500 |
| phosphorus doped oxide 20 | 2500 |
| metal layer 22 | 12,000 |

Figure 2:
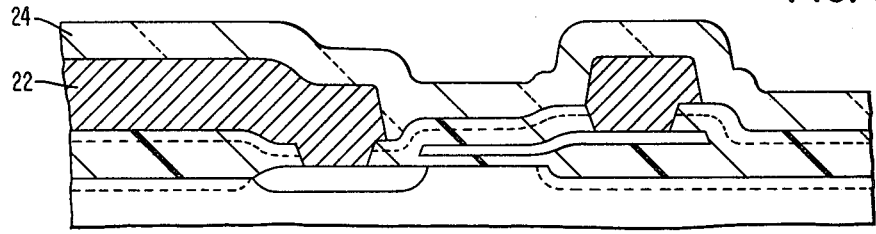
FIG. 2 illustrates the device of FIG. 1 after plasma deposition of a layer of silicon nitride.

Referring now to FIG. 2, a relatively thin passivating layer of silicon nitride 24 having a thickness of about 7000 Angstroms is deposited by plasma enhanced CVD in a commercial plasma reactor. The use of silicon nitride for passivating layer 24 is based on its excellent dielectric properties and its ability to be selectively etched in preference to the underlying phosphorus doped oxide, particularly by the dry plasma etching process, described below. The thickness of layer 24, although substantially thinner than that suggested by the prior art for such purposes is beneficial with respect to reducing the abruptness in vertical step-height required to be made by the overlying second level of metallurgy to be subsequently deposited. The electrical and physical characteristics of plasma enhanced CVD silicon nitride have been found preferable to those of more conventional dielectric materials.

Figure 3:
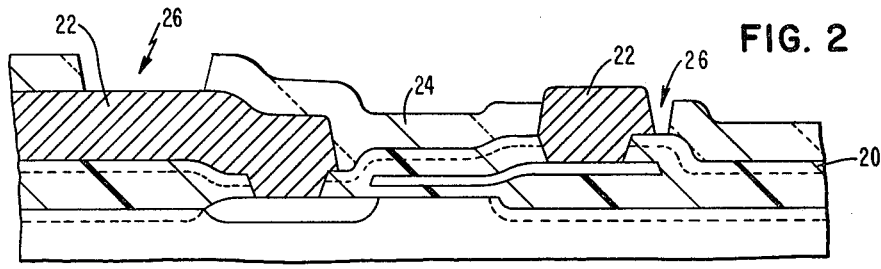
FIG. 3 illustrates the device of FIG. 1 after plasma etching of via holes in the silicon nitride layer at points where the second level metal layer is to contact the first metal layer.

Following the deposition of silicon nitride layer 24, a photolithographic processing step is used to provide via holes through the nitride layer to provide the structure shown in FIG. 3. This etching step is carried out using conventional photoresist processing steps in conjunction with a via hole mask. Because of the ability to selectively etch only the silicon nitride layer 24, size and positioning of the via holes defined by the via hole mask may be designed so that the resulting via holes, after etching, overlap one or both edges of the first metal line, as illustrated with respect to the line on the right of FIG. 3. In the design of the via hole mask, the size of the mask image is chosen to provide a minimum area of contact between the first and second metal lines. Initially, the mask image of the via hole is defined having a dimension in the direction of the width of the first metal equal to, greater than or less than that width. During the photolithographic process of defining the via hole in the nitride layer, the actual dimensions of the via hole are increased and its position relative to the first metal line may be off-set due to mask positioning errors to provide an overlap via, as shown in FIG. 3.

Via holes 26 may be etched using a dry plasma etching environment such as provided by a plasma consisting of about 8.5% by volume of oxygen and the balance being tetrafluoromethane, available as a premixed proprietary gas designated DE 100 from LFE Corporation, Waltham, Mass. When silicon nitride layer 24 is etched in an LFE 1002 Plasma Etch System operated at 75 watts power and at 75° C., the etch rate of layer 24 is about 1400 Angstroms per minute while that of the underlying oxide layer 20 is less than 100 Angstroms per minute. This etch rate differential, combined with a 10% overetch of the thin silicon nitride layer 24, removes less than 50 Angstroms of layer 20. The ability of routinely provide for the overetching of nitride layer 24 is significant from a manufacturing point of view, since it reduces the etch monitoring tolerances in a large scale manufacturing environment.

Figure 4:
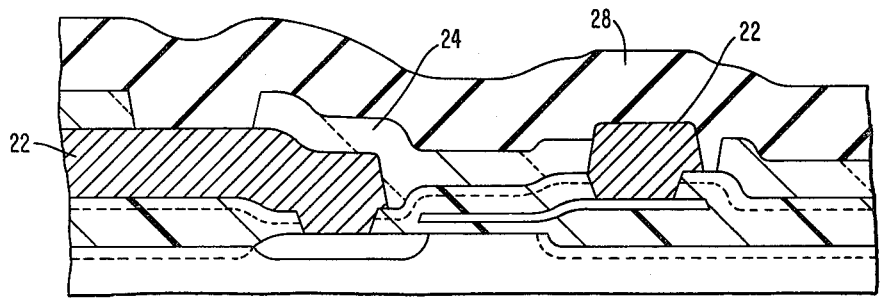
FIG. 4 illustrates the device of FIG. 1 after deposition of a polyimide polymer-forming dielectric layer.

After the initial formation of via holes 26 in nitride layer 24, a second, relatively thick passivating dielectric layer in the form of an organic polymer, preferably a polyimide forming precursor, layer 28 is applied to the surface of the substrate as shown in FIG. 4. The application, curing and etching of polyimide layer 28 is preferably accomplished as taught in U.S. Pat. No. 4,152,195 by Bahrle et al. The preferred thickness of polyimide layer 28 is about 15,000 Angstroms, or about twice the thickness of silicon nitride layer 24.

Figure 5:
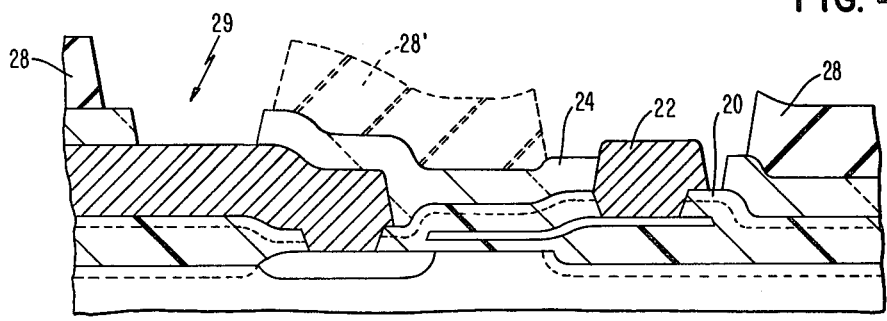
FIG. 5 illustrates the device of FIG. 1 after the non-critical etching of enlarged via holes in the polymide layer.

Following the application and at least partial curing of polyimide layer 28, a second set of via holes are provided to expose those portions of first metal layer 22 to which contact is desired by the next to be deposited second-level metal layer. Etching of layer 28 may be achieved either by a wet, e.g. KOH, or a dry, e.g. oxygen plasma, process as the size of the vias and polyimide etch bias are not critical at this point in the process. It is preferable to use over-sized via holes, as shown in FIG. 5, in order to reduce the positional criticality of this etching step. In areas of the substrate where via holes are closely spaced, it is also preferable to enlarge the polyimide via holes 29 to include more than a single silicon nitride via, as illustrated by the dashed portion 28' of the layer 28 in FIG. 5, which is preferably removed when the polyimide layer 28 is etched.

Figure 6:
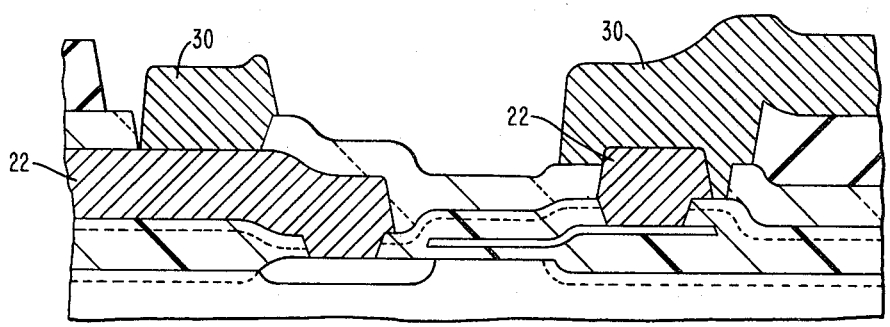
FIG. 6 illustrates the device of FIG. 1 after selective deposition of the second metal layer.

After etching of the via holes in polyimide layer 28 and final curing of the polyimide, if required, the second-level metal interconnection layer 30, shown in FIG. 6, is deposited by a lift-off process in a manner similar to that of first metal layer 22. As shown in FIG. 6, the second metal layer 30 may or may not be deposited beyond the area defined by the silicon nitride vias 26, thereby, allowing the formation of a dense second level metal pattern, taking full advantage of the fine line capability of the process. This is achieved by not requiring vias completely covered by second metal or the use of disimilar first and second level metal. The thickness of layer 30 is about 20,000 Angstroms.

The use of a composite nitride/polyimide dielectric between first and second metal layers, provides important features to the metallization system. Interlevel defects are reduced due to the presence of two independently applied layers. Low capacitance is provided between crossing first and second metal lines, since the dielectric constant for polyimide is about 3.4 verses 7 for the plasma nitride. Due to the planarizing properties of polyimide the planarity of the second level metal layer is improved when compared to structures using a single CVD dielectric.

Figure 7:
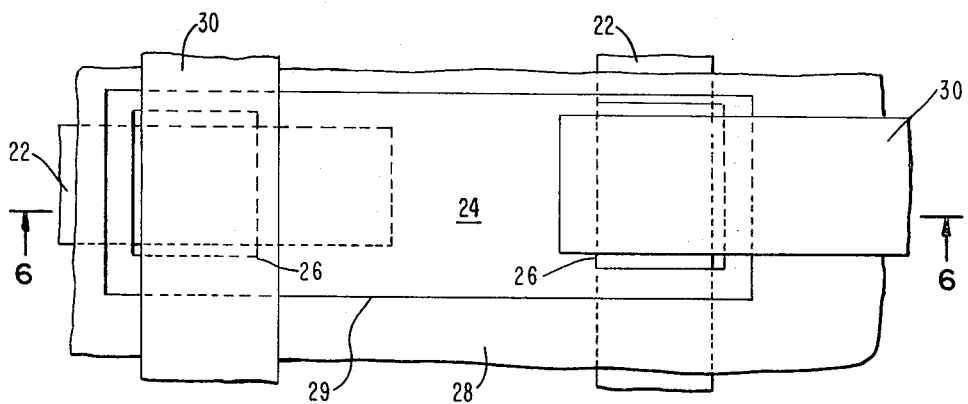
FIG. 7 is a plan view of the device of FIG. 6 and shows the relationship of the metal layers to the via holes.

FIG. 7 is a plan view of the double level metallized substrate of FIG. 6 and shows the relationship between the via holes 26 and 29 and first and second level metal layers 22 and 30.

Figure 8:
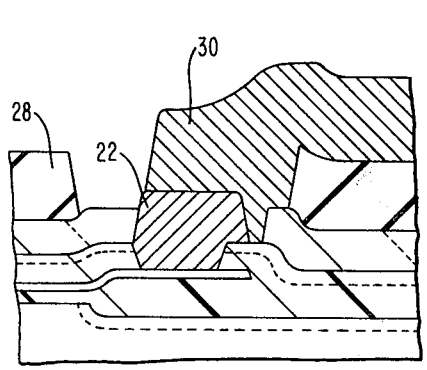
FIGS. 8 and 9 are cross-sectional and plan views of a second embodiment of the invention in which the second metal layer only partially overlaps the first metal line within the etched vias.
Figure 9:
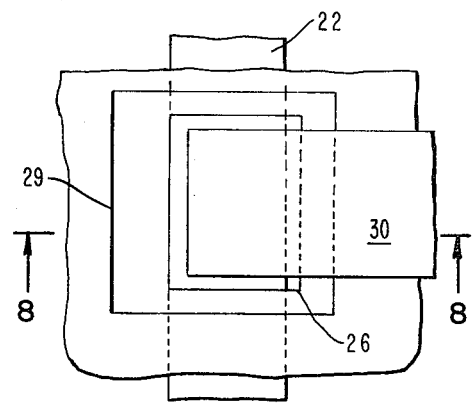

FIG. 8 shows an alternative application of second metal layer 30, in which complete overlap of the first level metal is not required. FIG. 9 is a plan view of the structure in FIG. 8 and shows the relationship between the via holes and metal layers.

The structure of FIG. 6 is preferably completed by the application of a second layer of polyimide, not shown, having a thickness of about 6 microns. Contact metallurgy is then provided by etching contact vias through the last polyimide layer and depositing desired contact pad structures, as is well known in the art.

While the invention has been described in terms of a single embodiment, those skilled in the art will appreciate the fact that certain variations are possible. For example, the method of the invention may be extended to devices having three or more levels of interconnection metallurgy. Multiple layers of polyimide can also be used to form all, or part of, the dielectric between metal layers.

What is claimed is:

1. The method for providing multilevel interconnections for an integrated circuit comprising the steps of:
    providing a first patterned layer of interconnect metallurgy on the surface of a semiconductor substrate passivated with an oxide of silicon;
    blanket depositing a layer of silicon nitride over said substrate;
    photolithographically defining overlap via holes only through said silicon nitride layer to expose portions of said first patterned layer where interlevel contacts are desired;
    blanket depositing a layer of organic dielectric material over said substrates said organic dielectric layer being thicker than said silicon nitride layer;
    photolithographically defining oversized via holes, larger than said overlap via holes, in said organic dielectric layer to expose said overlap via holes and to re-expose said portions of said first patterned layer; and
    depositing a second patterned layer of interconnection metallurgy over said substrate to form continuous interconnection segments contacting said first patterned layer through said overlap and oversized via holes and passing over at least portions of said organic dielectric layer and said silicon nitride layer.

2. The method of claim 1 wherein said first and second patterned layers comprise aluminum.

3. The method of claim 1 wherein said organic dielectric material is capable of forming a polyimide upon curing.

4. The method of claim 1 wherein said via holes are defined by plasma etching.

5. The method of claim 1 wherein said patterned layers are deposited by a lift-off technique.

6. The method of claim 1 wherein the ratio of the thickness of said nitride layer and said organic dielectric material is about one to two.

7. The method of claim 6 wherein said silicon nitride layer is about 7000 Angstroms in thickness.

8. The method of claim 1 wherein said first patterned layer of interconnection metallurgy is selectively in contact with a polysilicon layer and said oxide of silicon is at least partially formed of oxidized polysilicon.

* * * * *